(12) United States Patent
Meguro et al.

(10) Patent No.: US 8,586,412 B1
(45) Date of Patent: Nov. 19, 2013

(54) SEMICONDUCTOR DEVICE AND METHOD FOR MANUFACTURING THEREOF

(71) Applicant: Spansion LLC, Sunnyvale, CA (US)

(72) Inventors: Kouichi Meguro, Tokyo (JP); Masanori Onodera, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/921,956

(22) Filed: Jun. 19, 2013

Related U.S. Application Data

(62) Division of application No. 12/049,900, filed on Mar. 17, 2008, now Pat. No. 8,492,890.

(30) Foreign Application Priority Data

Mar. 19, 2007 (JP) ................................. 2007-070016

(51) Int. Cl.
*H01L 21/00* (2006.01)

(52) U.S. Cl.
USPC .......................................... 438/108; 257/737

(58) Field of Classification Search
USPC ........... 257/737, E23.169, E21.502; 438/108, 438/106
See application file for complete search history.

(56) References Cited

U.S. PATENT DOCUMENTS

| | | |
|---|---|---|
| 6,841,454 B2 | 1/2005 | Nishiyama |
| 7,045,899 B2 | 5/2006 | Yamane et al. |
| 7,053,492 B2 * | 5/2006 | Takahashi et al. ............ 257/783 |
| 7,126,209 B2 * | 10/2006 | Minamio et al. .............. 257/666 |
| 7,614,301 B2 | 11/2009 | Saeki |
| 2001/0026010 A1 | 10/2001 | Horiuchi et al. |
| 2002/0041037 A1 | 4/2002 | Kobayshi et al. |
| 2004/0021234 A1 | 2/2004 | Shibata |
| 2005/0056916 A1 | 3/2005 | Sakamoto et al. |
| 2005/0194676 A1 | 9/2005 | Fukuda et al. |
| 2006/0035409 A1 | 2/2006 | Suh et al. |
| 2011/0248400 A1 * | 10/2011 | Onodera et al. .............. 257/737 |

* cited by examiner

*Primary Examiner* — Thao P. Le

(57) ABSTRACT

A semiconductor device which includes a first semiconductor chip, a second semiconductor chip flip-chip bonded to the first semiconductor chip, a resin portion for sealing the first semiconductor chip and the second semiconductor chip such that a lower surface of the first semiconductor chip and an upper surface of the second semiconductor chip are exposed and a side surface of the first semiconductor chip is covered, and a post electrode which pierces the resin portion and is connected to the first semiconductor chip, and a manufacturing method thereof are provided.

12 Claims, 15 Drawing Sheets

SEMICONDUCTOR DEVICE AND METHOD FOR MANUFACTURING THEREOF

CROSS-REFERENCE TO RELATED APPLICATIONS

This application is a Divisional application of and claims priority to U.S. patent application Ser. No. 12/049,900, filed on Mar. 17, 2008, titled "SEMICONDUCTOR DEVICE AND METHOD FOR MANUFACTURING THEREOF," by Meguro, et al, which is based on Japanese Patent Application No. 2007-070016 filed on Mar. 19, 2007, which are herein incorporated by reference.

TECHNICAL FIELD

The invention relates to a semiconductor device and a method for manufacturing thereof, and more particularly to a semiconductor device formed by flip-chip bonding a second semiconductor chip onto a first semiconductor chip and a method for manufacturing thereof.

BACKGROUND OF THE INVENTION

The semiconductor device formed by stacking plural semiconductor chips has been under development for the purpose of reducing the packaging density. The CoC (Chip-on-Chip) technique for flip-chip bonding the semiconductor chip onto the other one has been employed to reduce the packaging density.

Japanese Unexamined Patent Application Publication No. 2000-156461 discloses the following technique as shown in FIGS. 8 to 13. That is, the second semiconductor chip (numbered as 130 in the document) and the solder ball interposer (32 in the document) are flip-chip bonded (FCB) onto the semiconductor wafer (140 in the document), and then the second semiconductor chip is coated. The coating (34 in the document) is flattened to expose the surface of the solder ball interposer. The first semiconductor chip formed from the semiconductor wafer has the second semiconductor chip flip-chip bonded thereto and is coated to be connectable from the upper surface.

Japanese Unexamined Patent Application Publication No. 2004-146728 discloses the following technique. That is, the second semiconductor chip (numbered as 1 in the document) is flip-chip bonded onto the first semiconductor chip (2 in the document) to form the solder electrode (11 in the document) on the first semiconductor chip so as to be connectable to the outside at the position higher than the second semiconductor chip.

In the case where the second semiconductor chip is flip-chip bonded onto the first semiconductor chip for increasing the packaging density, it is difficult to satisfy the requirement to reduce the thickness of the second semiconductor chip to less than 100 μm due to difficulty in handling of the thin semiconductor chip from the wafer and the chip tray. In the case where the flip chip bonding (FCB) is performed with the Au (gold)-Au pressure bonding process, the following difficulty occurs in addition to the difficulty in handling of the semiconductor chip. That is, the thin semiconductor chip which has been pressure bonded causes the underfill material to flow to the upper surface of the semiconductor chip and to be further adhered to the bonding tool used for handling the semiconductor chip. Accordingly, it is difficult to reduce the thickness of the semiconductor chip used in the CoC technique for packaging the semiconductor chip through the FCB.

In the process disclosed in Japanese Unexamined Patent Application Publication No. 2000-156461 and Japanese Unexamined Patent Application Publication No. 2004-146728, the side surface of the first semiconductor chip is exposed, which may be damaged during the test or packaging to the interposer.

SUMMARY OF THE INVENTION

In view of the aforementioned difficulties, it is an object of the invention to ensure reduction of the semiconductor device thickness, and to suppress the damage applied to the first semiconductor chip.

According to an aspect of the present invention, there is provided a semiconductor device including a first semiconductor chip, a second semiconductor chip flip-chip bonded to the first semiconductor chip, a resin portion for sealing the first semiconductor chip and the second semiconductor chip such that a lower surface of the first semiconductor chip and an upper surface of the second semiconductor chip are exposed and a side surface of the first semiconductor chip is covered, and a post electrode which pierces the resin portion and is connected to the first semiconductor chip. In the aforementioned structure, the side surface of the first semiconductor chip is covered with the resin portion to suppress the damage applied to the first semiconductor chip. This also makes it possible to reduce the semiconductor device thickness.

According to another aspect of the present invention, there is provided a manufacturing method of a semiconductor device including the steps of forming a post electrode on a semiconductor wafer, flip-chip bonding a second semiconductor chip onto the semiconductor wafer, forming a groove in an upper surface of the semiconductor wafer, forming a resin portion on the semiconductor wafer for sealing to cover the post electrode and the second semiconductor chip, performing one of grinding and polishing of the resin portion and the second semiconductor chip such that an upper surface of the post electrode and an upper surface of the second semiconductor chip are exposed, performing one of grinding and polishing of a lower surface of the semiconductor wafer such that the semiconductor wafer is thinner than a depth of the groove, so as to form a first semiconductor chip from the semiconductor wafer, and cutting the resin portion along the groove to separate the first semiconductor chip. In the method according to the invention, grinding or polishing is performed in the state where the resin portion and the second semiconductor chip are flip-chip bonded onto the semiconductor wafer so as to reduce the thickness of the second semiconductor chip. As the second semiconductor chip is protected by the resin portion, the second semiconductor chip may be prevented from being cracked. The semiconductor wafer is subjected to the grinding or polishing to reduce its thickness to be smaller than the depth of the groove. The resin portion is cut along the groove to separate the first semiconductor chip. This makes it possible to cover the side surface of the first semiconductor chip with the resin portion.

DETAILED DESCRIPTION

Figure 1A:
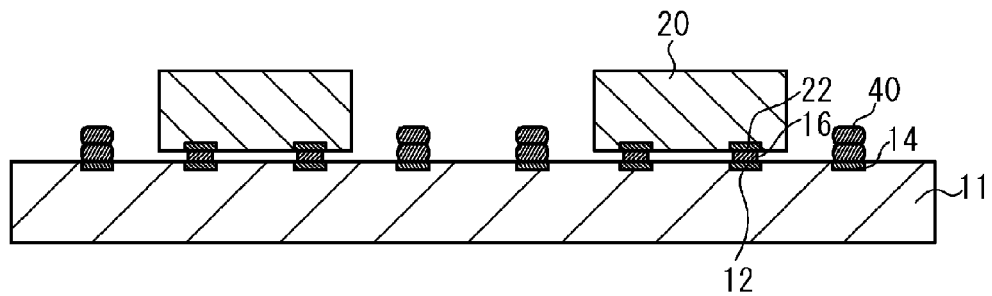
FIGS. 1A to 1C are sectional views showing manufacturing process steps of a semiconductor device according to a first embodiment (type 1).

Embodiments according to the invention will be described referring to the drawings.

First Embodiment

The method for manufacturing a semiconductor device according to a first embodiment will be described referring to FIGS. 1A to 2C. Referring to FIG. 1A, a post electrode 40 formed of for example, an Au stud bump is formed on a pad 14 on the upper surface of a silicon semiconductor wafer 11 having a circuit formed on its upper surface. A bump 16 formed of Au, Cu (copper) or solder is formed below a pad 22 on the lower surface of a second semiconductor chip 20 formed of silicon and having a circuit on its lower surface. An interconnection (not shown) allows the electric coupling between the post electrodes 40, between pads 14, and between the post electrode 40 and the pad 14. The second semiconductor chip 20 is flip-chip bonded onto the semiconductor wafer 11 with the bump 16. The thickness of the thus bonded semiconductor wafer 11 and the second semiconductor chip 20 is approximately 750 µm.

Figure 1B:
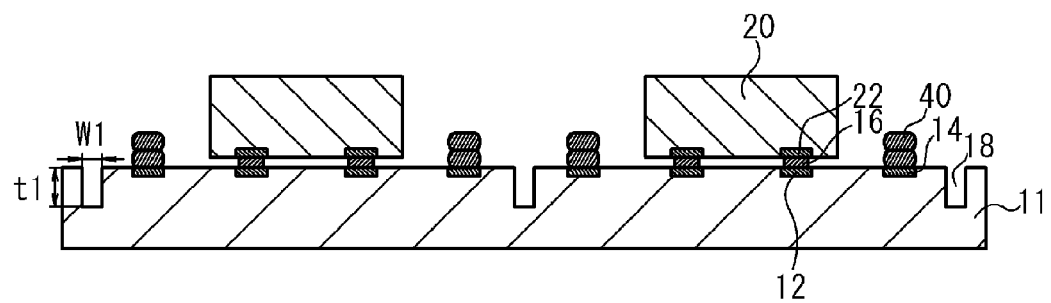

Referring to FIG. 1B, a groove 18 with its width w1 set to 60 µm and its depth t1 set to 60 µm is formed in the semiconductor wafer 11 by performing half dicing of the semiconductor wafer 11 using a dicing device.

Figure 1C:
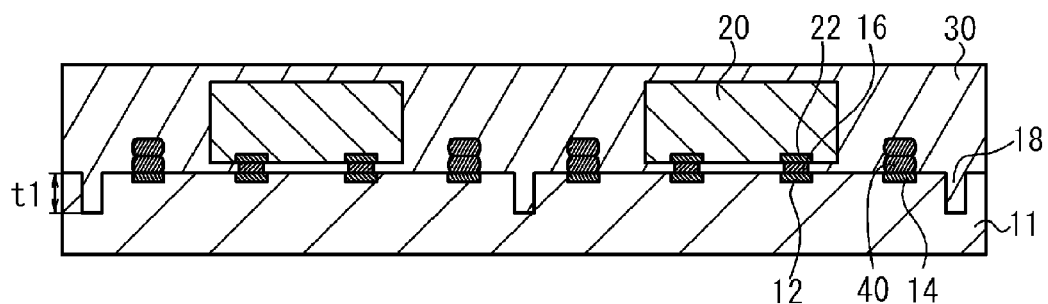

Referring to FIG. 1C, a resin portion 30 is formed to cover and seal the post electrode 40 and the second semiconductor chip 20, and to fill the groove 18. The resin portion 30 may be formed by spin coating and heating the liquid thermosetting epoxy resin. The resin portion 30 may be formed with the mold. The spin coating allows the resin portion 30 to be formed even in the narrow gap between the first semiconductor chip 10 and the second semiconductor chip 20. It is preferable to use a liquid resin containing no filler for the spin coating.

Figure 2A:
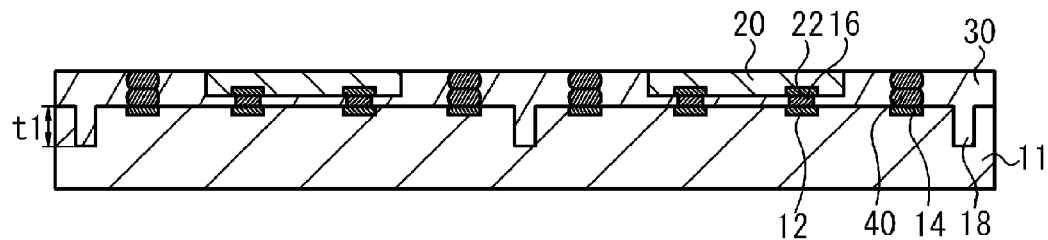
FIGS. 2A to 2C are sectional views showing manufacturing process steps of a semiconductor device according to the first embodiment (type 2).

Referring to FIG. 2A, the resin portion 30 and the second semiconductor chip 20 are ground such that the upper surfaces of both the post electrode 40 and the second semiconductor chip 20 are exposed. The resin portion 30 and the second semiconductor chip 20 are ground until the thickness of the second semiconductor chip 20 becomes 50 µm, and the thickness of the resin portion 30 becomes 80 µm, for example.

Figure 2B:
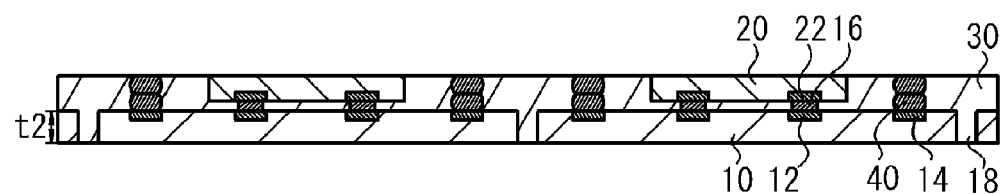

Referring to FIG. 2B, the lower surface of the semiconductor wafer 11 is subjected to the grinding to reduce its thickness to be smaller than the depth t1 of the groove 18, for example, to 50 µm. The semiconductor wafer 11 may be separated into the first semiconductor chips 10.

Figure 2C:
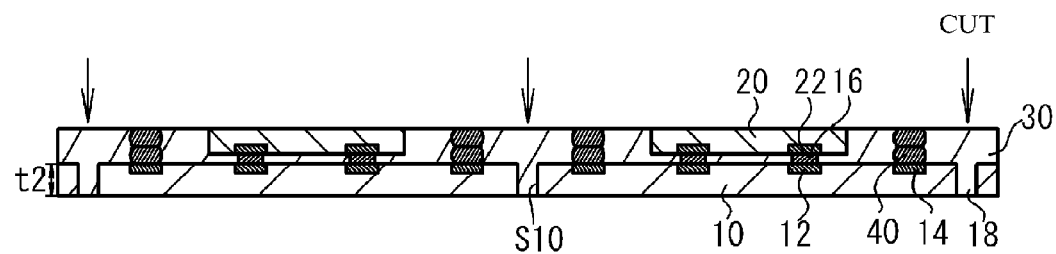

Referring to FIG. 2C, the resin portion 30 is cut along the groove 18 to separate the second semiconductor chips 20 using the dicing device. The blade used for cutting has the width narrower than that of the blade used for the half dicing as shown in FIG. 1B. This makes it possible to cut the resin portion 30 with the cutting width smaller than the width w1 of the groove 18. If the width t1 of the half dicing is set to 60 µm, and the cutting width is set to 40 µm, the resin portion 30 is allowed to remain on the side surface of the first semiconductor chip 10 by the width of approximately 10 µm.

Figure 3:
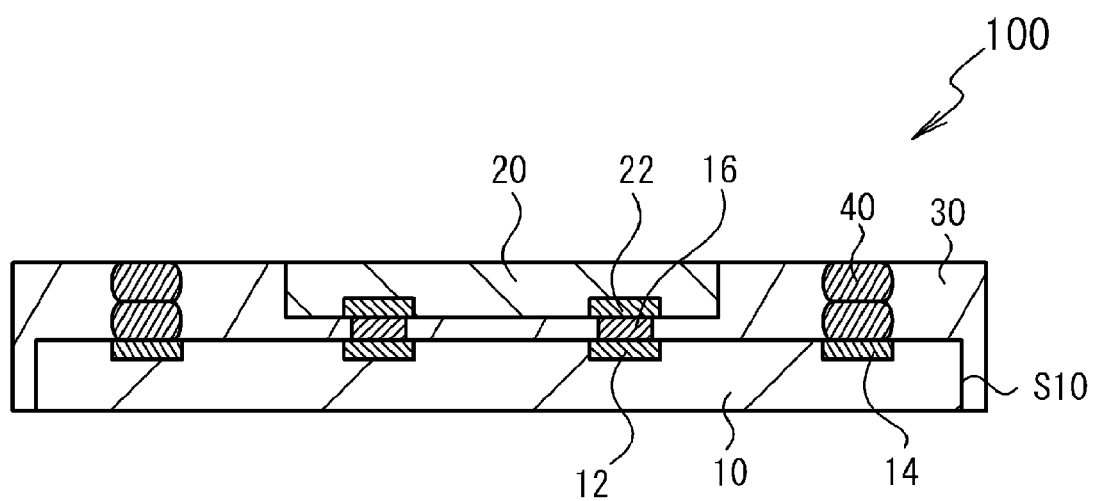
FIG. 3 is a sectional view of the semiconductor device according to the first embodiment.

FIG. 3 is a sectional view of a semiconductor device 100 according to the first embodiment. Referring to FIG. 3, the semiconductor device 100 has a CoC structure formed by flip-chip bonding the second semiconductor chip onto the first semiconductor chip 10. The resin portion 30 seals the first semiconductor chip 10 and the second semiconductor chip 20 such that the lower surface of the first semiconductor chip 10 and the upper surface of the second semiconductor chip 20 are exposed, and the side surfaces S10 of the first semiconductor chip 10 are covered. The post electrode 40 pierces the resin portion 30 to be connected to the first semiconductor chip 10.

In the case where the second semiconductor chip 20 is flip-chip bonded onto the first semiconductor chip 10, it is difficult to reduce the thickness of the second semiconductor chip 20 to less than 100 µm owing to handling difficulty. In the manufacturing method of the semiconductor device 100 according to the first embodiment, the resin portion 30 and the second semiconductor chip 20 which are flip-chip bonded onto the semiconductor wafer 11 are ground as shown in FIG. 2A so as to reduce the thickness of the second semiconductor chip 20 to less than 100 µm, for example. As the second semiconductor chip 20 is protected by the resin portion 30 during the grinding, the second semiconductor chip 20 is prevented from being cracked. As shown in FIG. 1B, the groove 18 is formed in the semiconductor wafer 11, and as shown in FIG. 2B, the semiconductor wafer 11 is subjected to the grinding such that its thickness is smaller than the depth t1 of the groove 18. The resin portion 30 is cut along the groove 18 to separate the first semiconductor chips 10. As the side surface S10 of the first semiconductor chip 10 is covered with the resin portion 30 as shown in FIG. 3, the first semiconductor chip 10 may be prevented from being damaged during the test or packaging of the semiconductor device 100, that is, handling thereof. The resin portion 30 is ground such that the upper surface of the post electrode 40 is exposed as shown in FIG. 2A. In this way, the post electrode 40 pierces the resin portion 30 as shown in FIG. 3 to be electrically coupled with the first semiconductor chip 10 from the upper surface of the resin portion 30.

Referring to FIG. 2C, the first semiconductor chips 10 may be separated while reducing the thickness of the semiconductor device 100, regardless of whether the resin portion 30 remains on the side surface S10 of the first semiconductor chip 10. However, it is preferable to cut the semiconductor wafer 11 such that the resin portion 30 remains on the side surface S10 of the first semiconductor chip 10. This makes it possible to suppress the damage applied to the first semiconductor chip 10.

The resin portion 30 may be formed to partially coat the side surface S10 of the first semiconductor chip 10. Preferably, however, the resin portion 30 is formed to entirely coat the side surface S10 of the first semiconductor chip 10 as shown in FIG. 3. This makes it possible to further suppress the damage applied to the first semiconductor chip 10.

Preferably, the post electrode 40 is electrically coupled not only with the first semiconductor chip 10 but also with the second semiconductor chip 20 via the interconnection (not shown) of the first semiconductor chip 10. This makes it possible to connect the first and the second semiconductor chips 10 and 20 to the outside via the post electrode 40.

Preferably, the post electrode 40 is formed of the stud bump so as to be easily produced. The number of threads of the stud bump may be set to an appropriate value depending on a preferable height of the post electrode 40.

Second Embodiment

Figure 4:
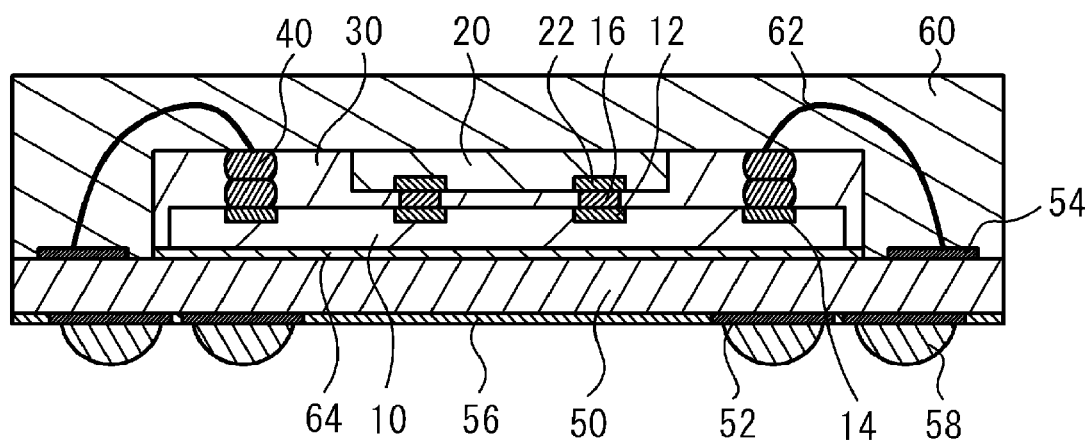
FIG. 4 is a sectional view of a semiconductor device according to a second embodiment.

A second embodiment is an example for packaging the semiconductor device 100 on the interposer. Referring to FIG. 4, the semiconductor device 100 according to the first embodiment is mounted on an insulated interposer 50 (mount portion) formed of the glass epoxy and the like through a die adhesive material 64 such as an adhesive agent. The upper surface of the post electrode 40 is connected to an electrode 54 of the interposer 50 via a bonding wire 62. The semiconductor device 100 is sealed with a sealing portion 60 formed of a resin material. A solder ball 58 is formed on the lower surface of the interposer 50 via an electrode 52. The electrodes 52 and 54 are connected by a connection portion (not shown) provided on the interposer 50. The solder resist 56 is applied onto the lower surface of the interposer 50 so as not to be in contact with the solder ball 58. The semiconductor device 100 has the same structure as that of the first embodiment shown in FIG. 3, and the explanation thereof, thus will be omitted.

The second embodiment allows the semiconductor device 100 according to the first embodiment to be packaged onto the interposer 50. The semiconductor device 100 has the post electrode 40 exposed to the upper surface of the resin portion 30 as shown in FIG. 3. This makes it possible to implement the test prior to packaging of the semiconductor device 100 as shown in FIG. 4, thus improving the yield of the semiconductor device after packaging.

The embodiment allows the thickness of the semiconductor device 100 to be reduced to 130 μm, thus thinning the semiconductor device according to the second embodiment.

Third Embodiment

Figure 5A:
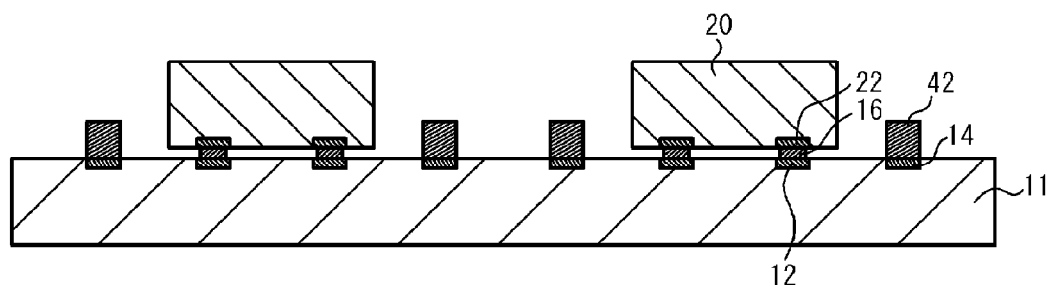
FIGS. 5A to 5C are sectional views showing manufacturing process steps of a semiconductor device according to a third embodiment.
Figure 5B:
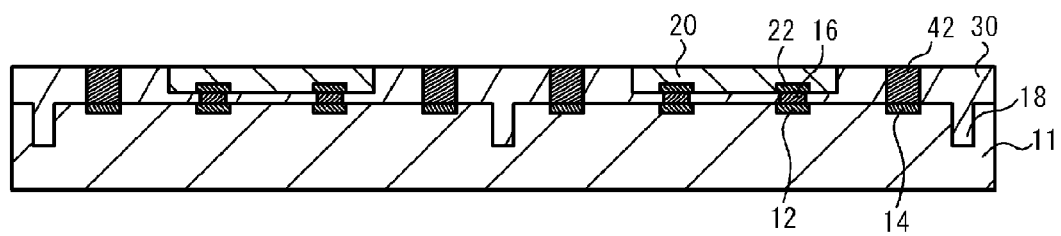
Figure 5C:
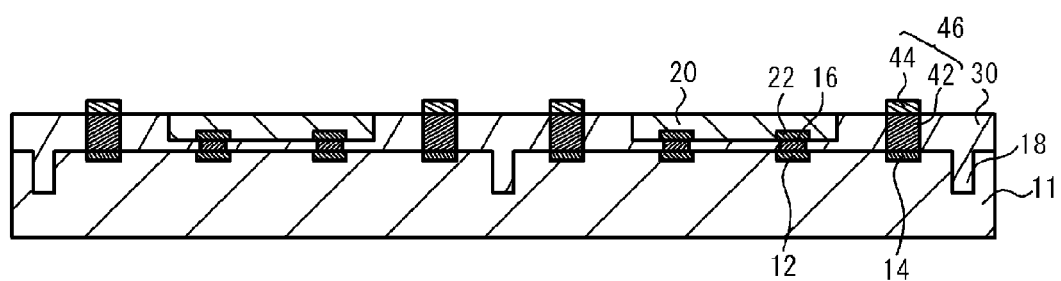

A third embodiment is an example for forming the post electrode through plating. Referring to FIGS. 5A to 5C, the method for manufacturing the semiconductor device according to the third embodiment will be described. Referring to FIG. 5A, a Cu layer 42 formed of Cu is formed on a pad 14 on the semiconductor wafer 11 through electrolytic plating. The other structure of the embodiment is the same as that of the first embodiment shown in FIG. 1A, and the explanation thereof, thus will be omitted.

Referring to FIG. 5B, the same manufacturing steps as those of the first embodiment shown in FIGS. 1B and 1C are performed. The resin portion 30 and the second semiconductor chip 20 are ground until the upper surface of the Cu layer 42 is exposed. Referring to FIG. 5C, a Ni layer 44 formed of Ni (nickel) is formed on the Cu layer 42 through nonelectrolytic plating, thus forming a post electrode 46 formed of the Cu layer 42 and the Ni layer 44. The manufacturing steps of the first embodiment shown in FIGS. 2A to 2C are performed to complete production of the semiconductor device according to the third embodiment.

Figure 6:
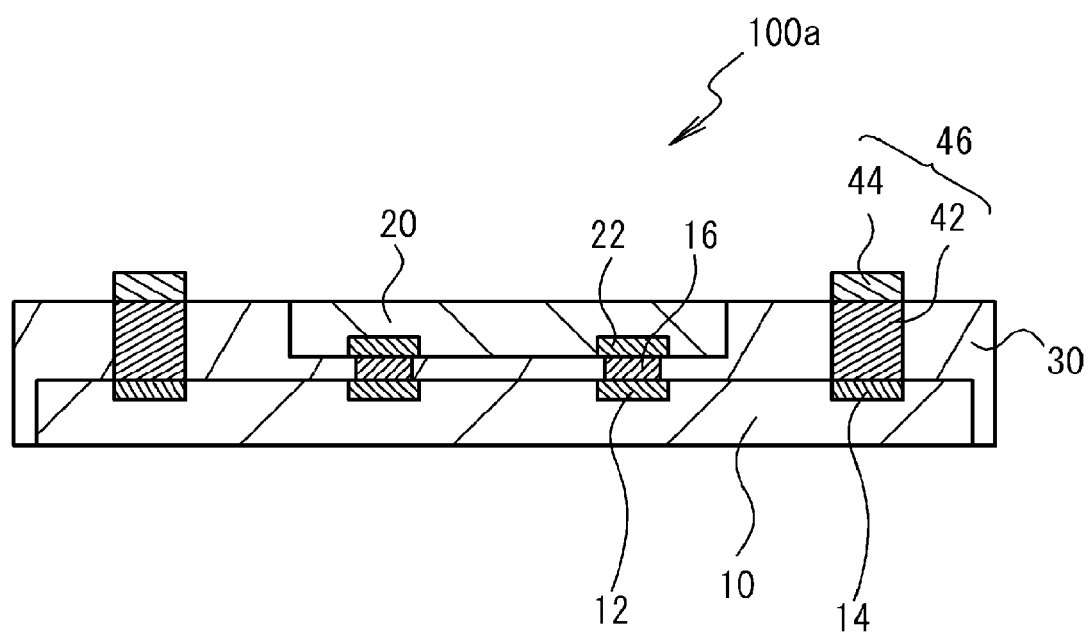
FIG. 6 is a sectional view of the semiconductor device according to the third embodiment.

FIG. 6 is a sectional view of a semiconductor device 100a according to the third embodiment, which has the post electrode 46 formed of the Cu layer 42 (electrode layer) and the Ni layer 44 (barrier layer). The other structure is the same as that of the first embodiment shown in FIG. 3, and the explanation thereof, thus will be omitted. The Ni layer 44 functions as the barrier layer when the solder ball is formed on the post electrode 46. The Ni layer 44 does not have to be provided, but it is preferable to provide the Ni layer as the barrier layer. The Cu layer 42 may be the electrode layer using a metal other than Cu. However, it is preferable to use a material with a small resistivity. Preferably, the barrier layer exhibits high barrier performance. The thickness of the Ni layer 44 may be selected in the range where the barrier function is performed.

Figure 7:
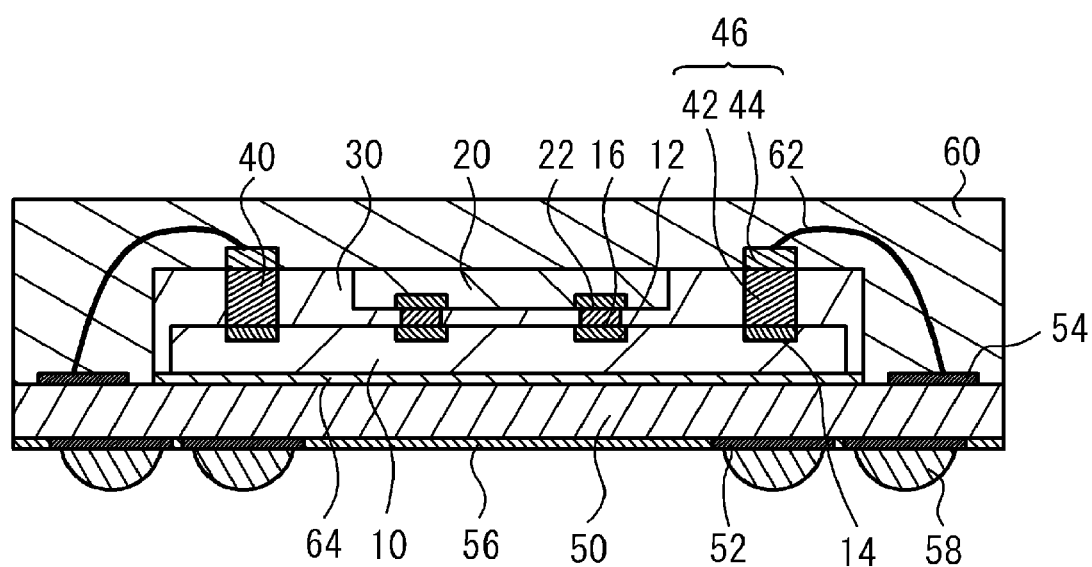
FIG. 7 is a view showing the semiconductor according to the third embodiment in a packaged state.

FIG. 7 is an example for packaging the semiconductor device 100a according to the third embodiment onto the interposer 50. The structure of the embodiment is the same as that of the second embodiment shown in FIG. 4 except that the semiconductor device 100a is packaged, and the explanation thereof, thus will be omitted.

In the first and the second embodiments, the stud bump is used as the post electrode 40 which may be formed without using the plating apparatus for Cu plating as in the third embodiment. Meanwhile, in the third embodiment, the post electrode 46 may be formed through the plating, and does not have to be individually produced unlike the stud bump used in the first and the second embodiments. Accordingly, the use of the third embodiment is advantageous for manufacturing a large amount of the semiconductor devices. It is difficult to form the tall post electrode 40 with the stud bump. The use of the third embodiment is advantageous to form the relatively tall post electrode 40. The post electrode 40 or 46 may be formed through an arbitrary process other than the use of the stud bump or the plating so long as it pierces the resin portion 30 to be electrically coupled with the first semiconductor chip 10 from the upper surface of the resin portion 30.

Fourth Embodiment

Figure 8:
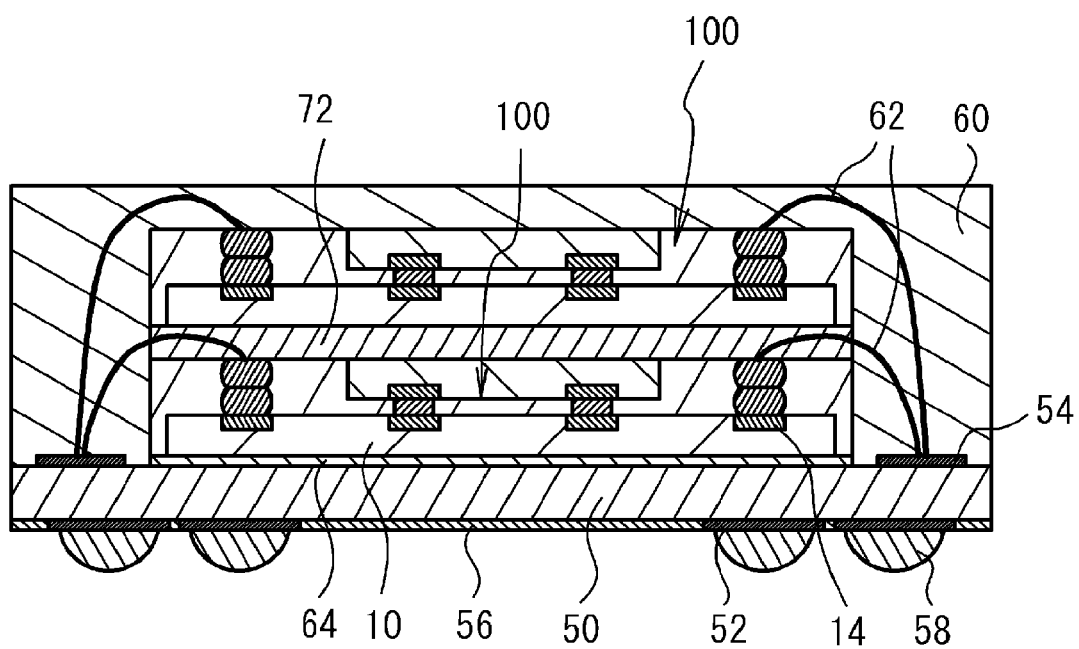
FIG. 8 is a sectional view of a semiconductor device according to a fourth embodiment.

A fourth embodiment is an example for packaging plural semiconductor devices 100 on the interposer 50. Referring to FIG. 8, two stacked semiconductor devices 100 according to the first embodiment are packaged on the interposer 50 (mount portion) via die adhesive materials 64 and 72 as the adhesive agent. The other structure is the same as that of the second embodiment shown in FIG. 4, and the explanation thereof, thus will be omitted. The fourth embodiment is capable of reducing the thickness of the semiconductor device 100. In this way, the plural semiconductor devices 100 may be packaged onto the interposer 50.

Fifth Embodiment

Figure 9:
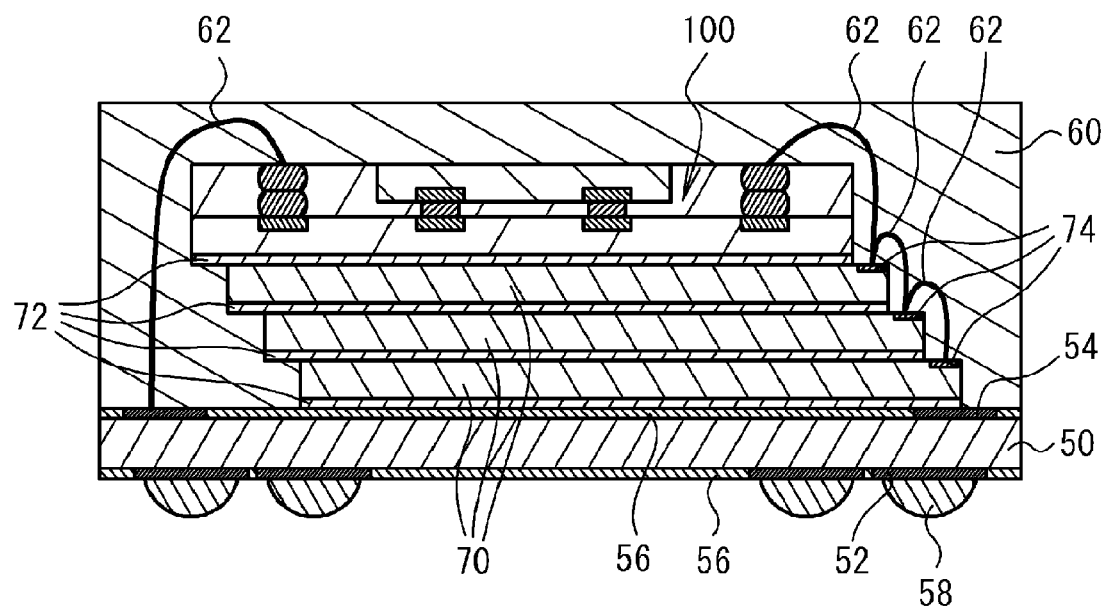
FIG. 9 is a sectional view of a semiconductor device according to a fifth embodiment.

A fifth embodiment is an example for packaging the semiconductor device 100 and the plural semiconductor chips onto the interposer 50. Referring to FIG. 9, plural semiconductor chips 70 which are stacked are packaged onto the interposer (mount portion) 50 with the die adhesive material 72 as the adhesive agent. The semiconductor device 100 according to the first embodiment is packaged on the stacked semiconductor chip 70 via the die adhesive material 72. The bonding wire 62 is connected to a pad 74 formed on the upper surfaces of the post electrode 40 of the semiconductor device 100 and the semiconductor chip 70. The use of the bonding wire 62 electrically couples the semiconductor device 100, the interposer 50, and the semiconductor chips 70 with one another. The other structure is the same as that of the fourth embodiment shown in FIG. 8, and the explanation thereof, thus will be omitted. In the fifth embodiment, one or more semiconductor chips 70 may be stacked and packaged onto the interposer 50 together with the semiconductor device 100.

The fourth and the fifth embodiments show the example for packaging the semiconductor device 100 according to the first embodiment onto the interposer 50. Those embodiments allow the semiconductor device 100a according to the third embodiment to be packaged onto the interposer 50.

Sixth Embodiment

Figure 10A:
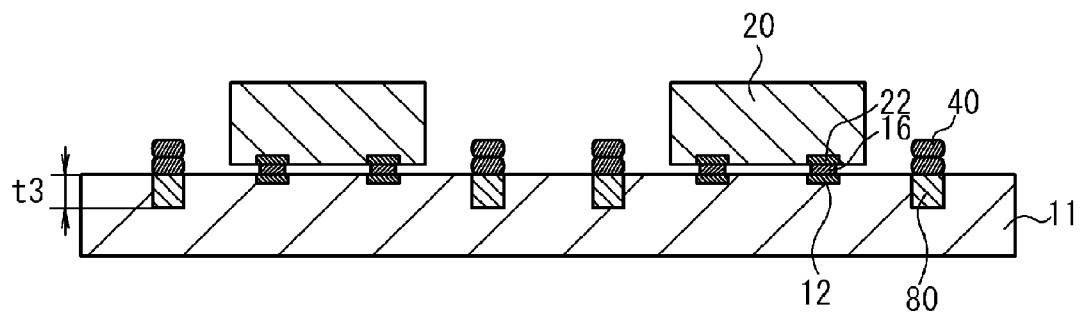
FIGS. 10A to 10C are sectional views showing manufacturing process steps of a semiconductor device according to a sixth embodiment.
Figure 10B:
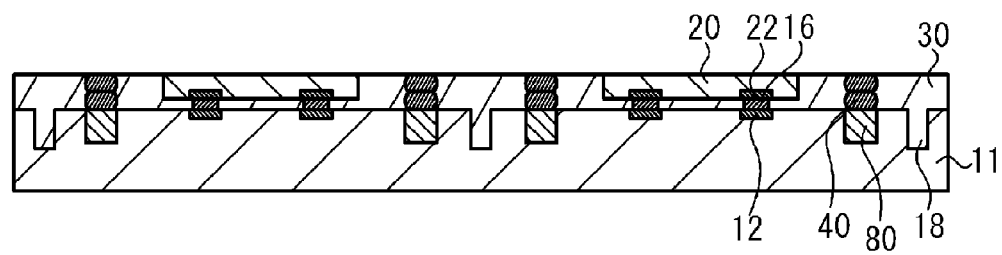
Figure 10C:
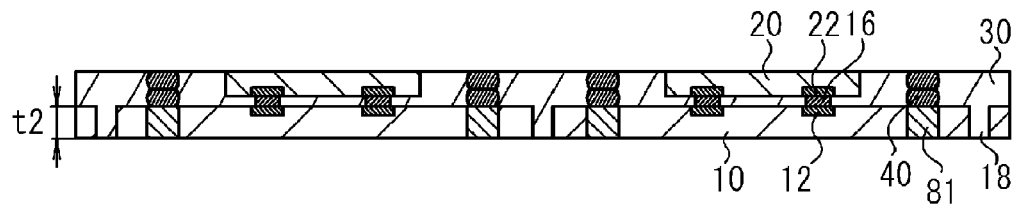

A sixth embodiment is an example with respect to the first semiconductor chip having the through electrode. Referring to FIGS. 10A to 10C, the method for manufacturing the semiconductor device according to the sixth embodiment will be described. Referring to FIG. 10A, an embedded electrode 80 made of Cu is formed to be embedded in the semiconductor wafer 11. The thickness of the embedded electrode 80, that is, t3 is substantially the same as the depth of the groove 18, which may be set to 60 μm, for example. The post electrode 40 is formed on the embedded electrode 80. The other structure is the same as that of the first embodiment shown in FIG. 1A, and the explanation thereof, thus will be omitted.

Referring to FIG. 10B, the same manufacturing steps as those of the first embodiment shown in FIGS. 1B to 2B are performed. The resin portion 30 and the second semiconductor chip 20 are ground until the upper surface of the post electrode 40 is exposed. Referring to FIG. 10C, the lower surface of the semiconductor wafer 11 is ground such that its depth becomes less than that of the embedded electrode 80 and the groove 18. This may divide the semiconductor wafer 11 to form the first semiconductor chip 10 as well as to form the through electrode 81 which pierces from the embedded electrode 80 to the first semiconductor chip 10. Thereafter, the manufacturing process of the first embodiment shown in FIG. 2C is performed to complete formation of the semiconductor device 10 according to the sixth embodiment.

Figure 11:
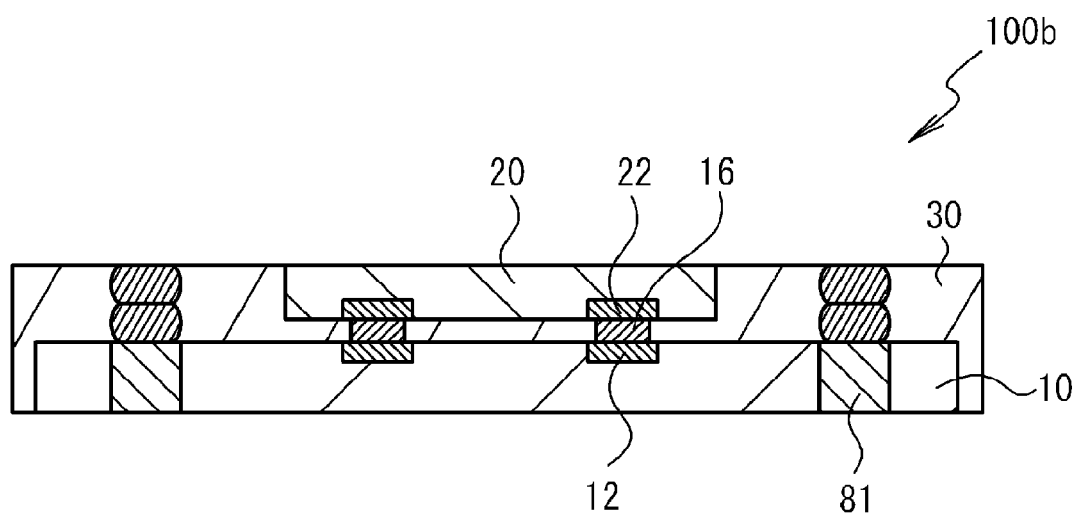
FIG. 11 is a sectional view of a semiconductor device according to a sixth embodiment.

Referring to FIG. 11, a semiconductor device 100b according to the sixth embodiment pierces the first semiconductor chip 10, and has the through electrode 81 connected to the post electrode 40. The other structure is the same as that of the first embodiment shown in FIG. 3, and the explanation thereof, thus will be omitted. In the sixth embodiment, the use of the through electrode 81 which pierces the first semiconductor chip 10 allows the first semiconductor chip 10 to be electrically coupled with the second semiconductor chip 20 from the upper and the lower surfaces of the semiconductor device 100b. The sixth embodiment shows the example for using the stud bump employed in the first embodiment as the post electrode 40. However, the Cu layer 42 formed through the plating process in the same manner as in the third embodiment may be used.

Seventh Embodiment

Figure 12:
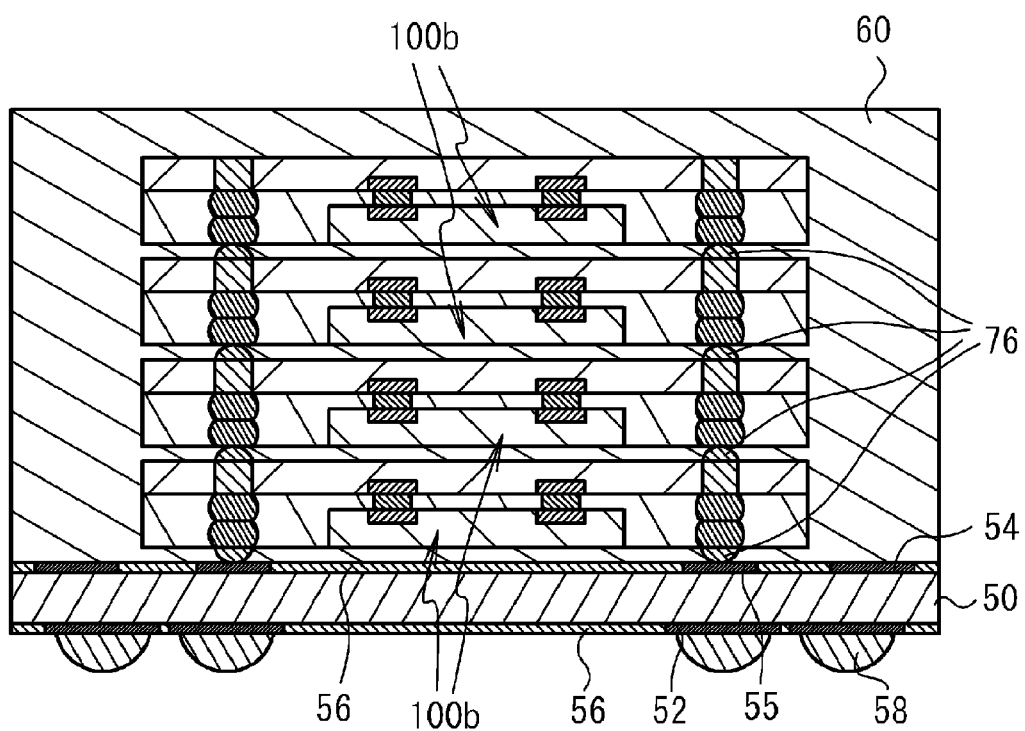
FIG. 12 is a sectional view of a semiconductor device according to a seventh embodiment.

A seventh embodiment is an example for stacking the semiconductor devices 100b to be packaged onto the interposer 50. Referring to FIG. 12, the plural semiconductor devices 100b are flip-chip bonded to be stacked via bumps 76. The thus stacked plural semiconductor devices 100b are further flip-chip bonded onto the interposer 50 (mount portion).

Figure 13:
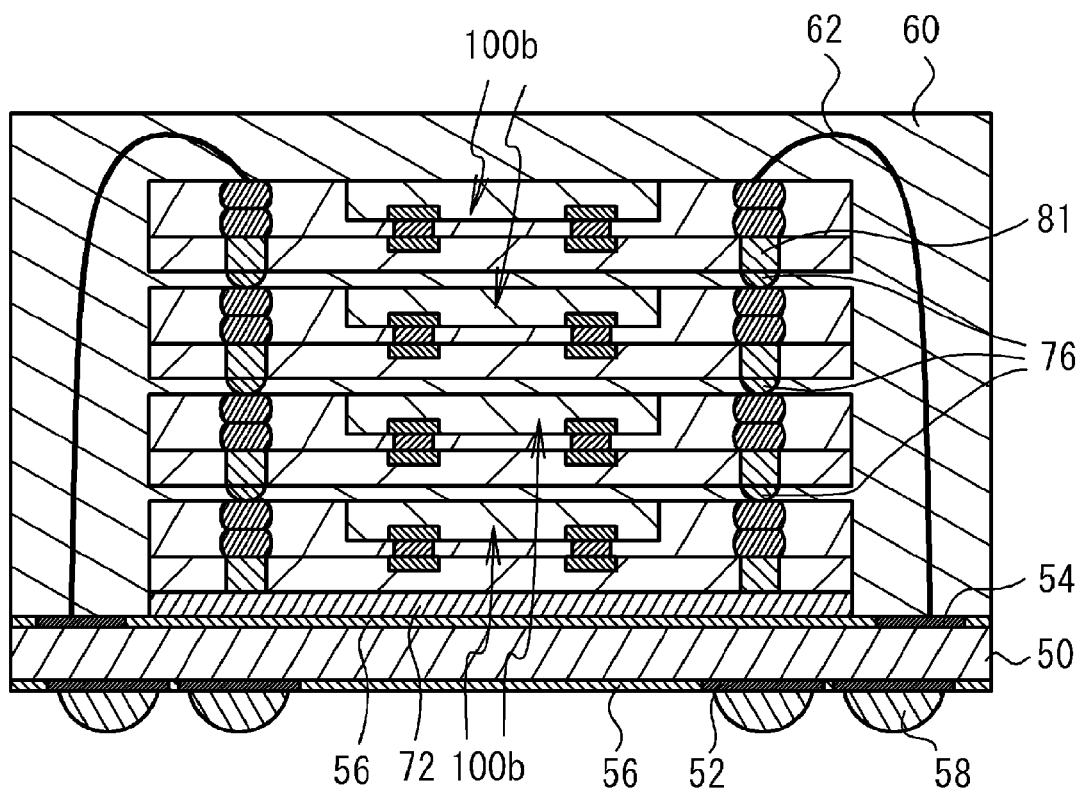
FIG. 13 is a sectional view of another semiconductor device according to the seventh embodiment.

Referring to FIG. 13, plural semiconductor devices 100b are flip-chip bonded via the bumps 76. The stacked plural semiconductor devices 100b are mounted on the interposer 50 via the die adhesive material 72, and electrically coupled with the interposer 50 with the bonding wire 62. The other structure is the same as that of the second embodiment shown in FIG. 4, and the explanation thereof, thus will be omitted.

The semiconductor device 100b according to the sixth embodiment electrically couples the first and the second semiconductor chips 10 and 20 from the upper and lower surfaces. Thus, the seventh embodiment makes it possible to layer the semiconductor devices 100b through the flip chip bonding.

Eighth Embodiment

Figure 14:
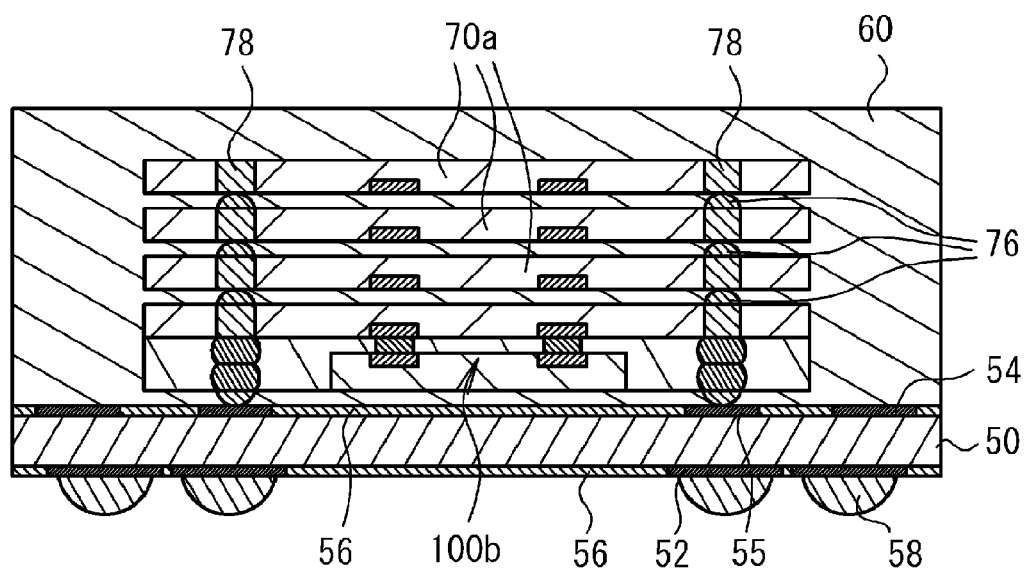
FIG. 14 is a sectional view showing a semiconductor device according to an eighth embodiment.

An eighth embodiment is an example for stacking the semiconductor device 100b and plural semiconductor chips to be packaged onto the interposer 50. Referring to FIG. 14, plural semiconductor chips 70a are flip-chip bonded to be stacked on the semiconductor device 100b via the bumps 76. The semiconductor chip 70a includes a through electrode 78 which pierces the semiconductor chip. The bump 76 is formed to be in contact with the through electrode 78. The semiconductor device 100b is flip-chip bonded onto the interposer 50 (mount portion).

Figure 15:
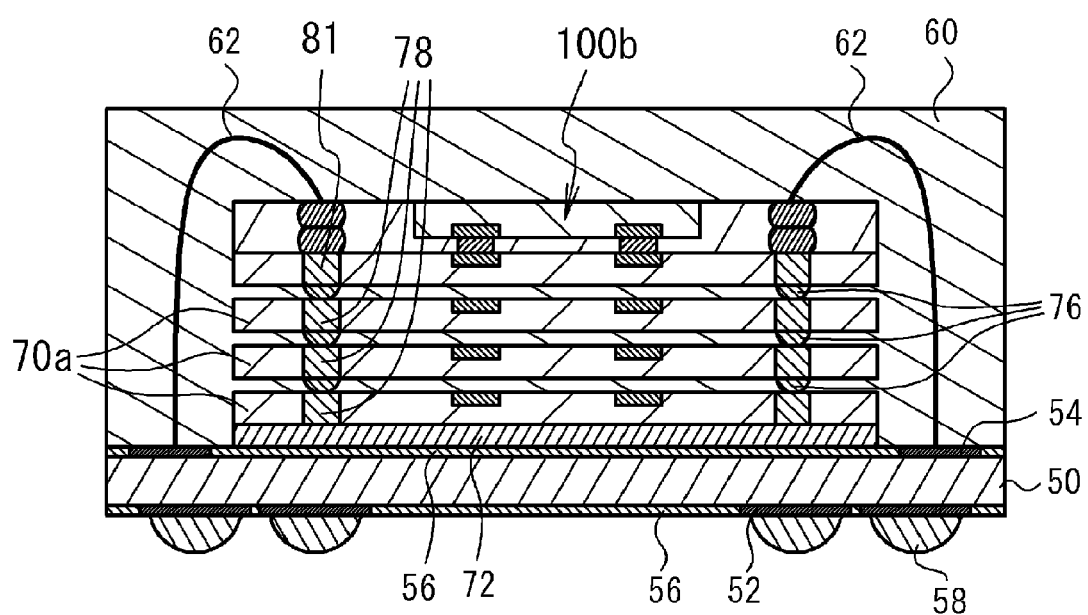
FIG. 15 is a sectional view of another semiconductor device according to the eighth embodiment.

Referring to FIG. 15, the plural semiconductor chips 70a are flip-chip bonded via the bumps 76. The semiconductor device 100b is flip-chip bonded onto the thus stacked plural semiconductor chips 70a. The plural stacked semiconductor chips 70a are mounted on the interposer 50 via the die adhesive material 72. The semiconductor device 100b and the interposer 50 are electrically coupled with the bonding wire 62. The other structure is the same as that of the second embodiment shown in FIG. 4, and the explanation thereof, thus, will be omitted.

The semiconductor device 100b according to the sixth embodiment allows the first semiconductor chip 10 and the second semiconductor chip 20 to be electrically coupled from its upper and lower surfaces. Thus, the eighth embodiment makes it possible to flip-chip bond the semiconductor device 100b onto the plural semiconductor chips 70a.

In the aforementioned embodiments, the single second semiconductor chip 20 is flip-chip bonded onto the first semiconductor chip 10. However, plural second semiconductor chips 20 may be flip-chip bonded onto the first semiconductor chip 10. In the embodiments, the resin portion 30 and the sealing portion 60 formed of epoxy resin are employed. However, they may be formed of polyimide resin, silicon resin and the like.

In the aforementioned embodiments, the resin portion 30, and either the second semiconductor chip 20 or the semiconductor wafer 11 are ground. However, they may be subjected to the polishing instead of the grinding. The interposer 50 has been described as the mount portion. However, the mount portion may be formed in an arbitrary form so long as it has the function of packaging the semiconductor device 100.

Finally, several aspects of the present invention are summarized as follows.

According to an aspect of the present invention, there is provided a semiconductor device including a first semiconductor chip, a second semiconductor chip flip-chip bonded to the first semiconductor chip, a resin portion for sealing the first semiconductor chip and the second semiconductor chip such that a lower surface of the first semiconductor chip and an upper surface of the second semiconductor chip are exposed and a side surface of the first semiconductor chip is covered, and a post electrode which pierces the resin portion and is connected to the first semiconductor chip. In the aforementioned structure, the side surface of the first semiconductor chip is covered with the resin portion to suppress the damage applied to the first semiconductor chip. This also makes it possible to reduce the semiconductor device thickness.

In the aforementioned structure, the resin portion may entirely cover the side surface of the first semiconductor chip. The structure is capable of further suppressing the damage applied to the first semiconductor chip.

In the aforementioned structure, the post electrode may be formed of a stud bump. In the structure, the post electrode may be structured to contain copper.

The aforementioned structure may further include a through electrode which pierces the first semiconductor chip and is connected to the post electrode. The structure allows the electric coupling with the first semiconductor chip from the upper and the lower surfaces.

In the aforementioned structure, the post electrode may be electrically coupled with the first semiconductor chip and the second semiconductor chip. In the structure, the post electrode exposed from the resin portion is used to connect the first and the second semiconductor chips.

The aforementioned structure may further include a mount portion to which the first semiconductor chip is packaged. The structure is capable of suppressing the damage applied to the first semiconductor chip when it is packaged onto the mount portion.

According to another aspect of the present invention, there is provided a manufacturing method of a semiconductor device including the steps of forming a post electrode on a semiconductor wafer, flip-chip bonding a second semiconductor chip onto the semiconductor wafer, forming a groove in an upper surface of the semiconductor wafer, forming a resin portion on the semiconductor wafer for sealing to cover the post electrode and the second semiconductor chip, performing one of grinding and polishing of the resin portion and the second semiconductor chip such that an upper surface of the post electrode and an upper surface of the second semiconductor chip are exposed, performing one of grinding and polishing of a lower surface of the semiconductor wafer such that the semiconductor wafer is thinner than a depth of the groove, so as to form a first semiconductor chip from the semiconductor wafer, and cutting the resin portion along the groove to separate the first semiconductor chip. In the method according to the invention, grinding or polishing is performed in the state where the resin portion and the second semiconductor chip are flip-chip bonded onto the semiconductor wafer so as to reduce the thickness of the second semiconductor chip. As the second semiconductor chip is protected by the resin portion, the second semiconductor chip may be prevented from being cracked. The semiconductor wafer is subjected to the grinding or polishing to reduce its thickness to be smaller than the depth of the groove. The resin portion is cut along the groove to separate the first semiconductor chip. This makes it possible to cover the side surface of the first semiconductor chip with the resin portion.

In the aforementioned process, the step for separating the first semiconductor chip may include a step for cutting the semiconductor wafer such that the resin portion remains on a side surface of the first semiconductor chip. The process suppresses the damage applied to the first semiconductor chip.

In the aforementioned process, the step for forming the post electrode may be performed using a stud bump or an electrolytic plating process.

The aforementioned process may include a step for forming an embedded electrode which is embedded in the semiconductor wafer. In the step for forming the post electrode, the post electrode may be formed on the embedded electrode. In the step for performing one of grinding and polishing of the lower surface of the semiconductor wafer, the lower surface of the semiconductor wafer may be subjected to one of the grinding and polishing such that the semiconductor wafer is thinner than a depth of the embedded electrode. The process allows the connection with the first semiconductor chip from the upper and the lower surfaces.

The aforementioned process may further include a step for packaging the first semiconductor chip onto a mount portion. The process is capable of reducing the thickness of the semiconductor device.

While the preferred embodiments of the present invention have been described in detail above, the present invention is not limited to those specific embodiments, and within the spirit and scope of the present invention, various modifications and alterations can be made.

We claim:

1. A manufacturing method of a semiconductor device comprising the steps of:
    forming a post electrode on a semiconductor wafer;
    flip-chip bonding a second semiconductor chip onto the semiconductor wafer;
    forming a groove in an upper surface of the semiconductor wafer;
    forming a resin portion on the semiconductor wafer for sealing to cover the post electrode and the second semiconductor chip;
    performing one of grinding and polishing of the resin portion and the second semiconductor chip such that an upper surface of the post electrode and an upper surface of the second semiconductor chip are exposed;
    performing one of grinding and polishing of a lower surface of the semiconductor wafer such that the semiconductor wafer is thinner than a depth of the groove, so as to form a first semiconductor chip from the semiconductor wafer; and
    cutting the resin portion along the groove to separate the first semiconductor chip.

2. The manufacturing method according to claim 1, wherein the step for separating the first semiconductor chip includes a step for cutting the semiconductor wafer such that the resin portion remains on a side surface of the first semiconductor chip.

3. The manufacturing method according to claim 1, further comprising a step for forming an embedded electrode which is embedded in the semiconductor wafer, wherein:
    in the step for forming the post electrode, the post electrode is formed on the embedded electrode; and
    in the step for performing one of grinding and polishing of the lower surface of the semiconductor wafer, the lower surface of the semiconductor wafer is subjected to one of the grinding and polishing such that the semiconductor wafer is thinner than a depth of the embedded electrode.

4. The manufacturing method of claim 2, wherein the resin portion entirely covers the side surface of the first semiconductor chip.

5. The manufacturing method of claim 3, wherein the post electrode contains copper.

6. The manufacturing method of claim 1 further comprising:

mounting the first semiconductor chip to an insulated interposer.

7. The manufacturing method of claim 1, wherein a thickness of the first semiconductor chip is approximately 50 μm.

8. The manufacturing method of claim 1, wherein the resin portion has a thickness of approximately 80 μm.

9. The manufacturing method of claim 2, wherein a thickness of the resin portion covering the side surface of the first semiconductor chip is approximately 10 μm.

10. The manufacturing method of claim 1, wherein the resin portion is formed by spin coating.

11. The manufacturing method of claim 1, wherein the resin portion comprises a liquid resin containing no filler.

12. The manufacturing method of claim 1, wherein a top surface of the post electrode is exposed and level with the resin portion.

* * * * *